United States Patent [19]

Blossfeld

[11] Patent Number: 4,477,965

[45] Date of Patent: Oct. 23, 1984

[54] PROCESS FOR MANUFACTURING A MONOLITHIC INTEGRATED SOLID-STATE CIRCUIT COMPRISING AT LEAST ONE BIPOLAR PLANAR TRANSISTOR

[75] Inventor: Lothar Blossfeld, Freiburg-Hochdorf, Fed. Rep. of Germany

[73] Assignee: ITT Industries, Inc., New York, N.Y.

[21] Appl. No.: 404,931

[22] Filed: Aug. 3, 1982

[30] Foreign Application Priority Data

Aug. 8, 1981 [EP] European Pat. Off. ........ 81 106214.0

[51] Int. Cl.³ .................... H01L 21/26; H01L 21/225
[52] U.S. Cl. ............................. 29/576 B; 29/577 C; 148/1.5; 148/187; 357/34; 357/91
[58] Field of Search ....................... 148/1.5, 187, 175; 29/576 B, 578, 577 C; 357/91, 34

[56] References Cited

U.S. PATENT DOCUMENTS

| | | | |
|---|---|---|---|
| 4,199,380 | 4/1980 | Farrell et al. | 148/1.5 |
| 4,242,791 | 1/1981 | Horng et al. | 29/578 |
| 4,333,774 | 6/1982 | Kamioka | 148/1.5 |
| 4,376,664 | 3/1983 | Hataishi et al. | 29/578 |

OTHER PUBLICATIONS

DAS, IBM-TDB, 22, (1979), 582-583.
Lee, IBM-TDB, 22, (1979), 1454.

*Primary Examiner*—Upendra Roy
*Attorney, Agent, or Firm*—Donald J. Lenkszus

[57] ABSTRACT

The invention proposes a process for manufacturing a monolithic integrated circuit comprising at least one bipolar transistor in which the dopings of the regions are inserted into the substrate (2) exclusively by way of ion implantations. The invention deals with the problem of the current gain value variations during mass-production. This problem is solved in that during the implantation of the base dopings, in which the base area (32) is defined by means of a photoresist mask (5), the emitter area (11) is covered with an oxidation masking layer portion (71), with the ions of the base region (3) being implanted into the substrate surface once at a low accelerating energy and a great dose, with the oxidation masking layer portion (71) serving as the mask and, the next time, at a high accelerating energy and a relatively small dose, in the course of which the oxidation masking layer portion (1) is penetrated.

17 Claims, 15 Drawing Figures

PROCESS FOR MANUFACTURING A MONOLITHIC INTEGRATED SOLID-STATE CIRCUIT COMPRISING AT LEAST ONE BIPOLAR PLANAR TRANSISTOR

BACKGROUND OF THE INVENTION

The invention is concerned with the manufacture of monolithic integrated solid-state circuits of high packing density employing planar transistors of small dimensions. The invention is based on the Triple-Diffusion Process (3D technology) as known from DE-OS No. 30 09 434 and from the technical journal "Electronics" of Aug. 7, 1975, pp. 104 to 106. This process is characterized by the fact that by means of ion implantations the dopings of the collector region, of the base region and of the emitter region are carried out in succession.

This process, hereinafter briefly referred to as the 3D process, apart from enabling the manufacture of bipolar integrated circuits of high packing density, offers the advantage of dispensing with the high-temperature processes required for depositing an epitaxial layer on to a substrate possibly provided with doping areas for manufacturing buried layers, as well as with the diffusion of insulating zones. These high-temperature processes which are required as a rule for effecting the electrical isolation of the individual transistors, are replaced in the 3D process by one single high-temperature process, namely the collector diffusion process. Finally, there are obtained planar transistors having regions diffused to one another.

The conventional process has disadvantage that the current gain values of the transistors are manufactured in a semiconductor wafer which is later divided into the solid-state circuit are subject to variations differing from wafer to wafer.

SUMMARY OF THE INVENTION

The invention is based on the recognition that variations of the aforementioned current gain values (B values) by a only percent become possible when the manufacturing processes are selected and carried out such that the total amount of charge carriers in the intrinsic base regions, i.e., in the area of the base region below the emitter region, becomes precisely controllable and also by employing non-compensated emitter regions. A non-compensated emitter region, according to "1979 IEEE", pp. 514 to 516 has the advantage that relatively high current gain values and increased cutoff frequencies become possible.

It is the object of the invention, therefore, to provide a manufacturing process for a monolithic integrated circuit comprising at least one bipolar planar transistor in which the spread of the current gain values of the planar transistors over the semiconductor wafers as well as over the individual integrated solid-state circuits is minimized.

In accordance with the invention, during the implantation of the base dopings, in which the base area is defined by means of a photoresist mask and the emitter area is covered with an oxidation masking layer portion the ions of the base region are implanted into the substrate surface first at a low accelerating energy and a relatively high dose, with the oxidation masking layer portion serving as the mask. A second implantation is made at a high accelerating energy and a relatively small dose during which the oxidation masking layer portion is penetrated.

The oxidation masking layer is preferably silicon nitride or a layer of silicon dioxide covered with a layer of silicon. In this particular case it is possible to use material for the etch masking layer with which the outer base region is covered may be a layer of silicon dioxide which is not etched by hot phosphoric acid used as the etching agent for silicon nitride.

It is particularly advantageous to embed into the etch masking layer, a contacting layer of a doped polycrystalline silicon which superficially contacts the base region and, therefore, can also be used as a lead-in or as a resistance to the base region.

One particular further embodiment of the process according to the invention deals with the problem of the compatibility with the well known silicon gate process for manufacturing integrated Si-gate field-effect transistors on the same semiconductor wafer and, consequently, with the manufacture of monolithic integrated solid-state circuits which, apart from bipolar transistors, also contain Si-gate field-effect transistors.

BRIEF DESCRIPTION OF THE DRAWINGS

The process according to the invention as well as the advantages thereof will now be explained hereinafter with reference to examples of embodiment shown in the accompanying drawings, in which.

DETAILED DESCRIPTION

Figure 1:
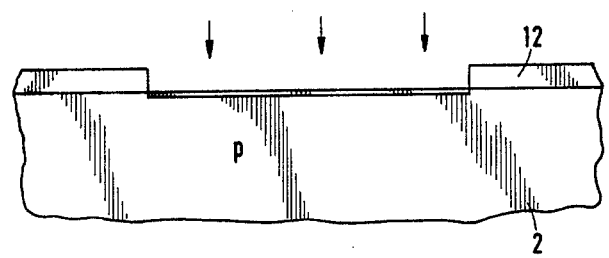
FIGS. 1 through 8 are elevational views in broken section illustrating a monolithic integrated solid state circuit at successive stages of the process in accordance with the invention.
Figure 2:
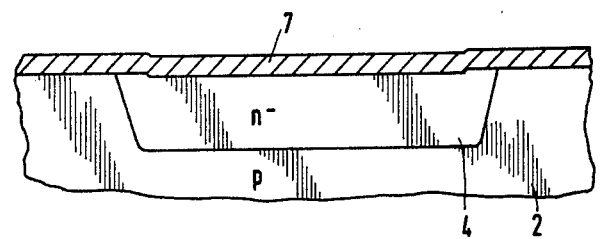
Figure 3:
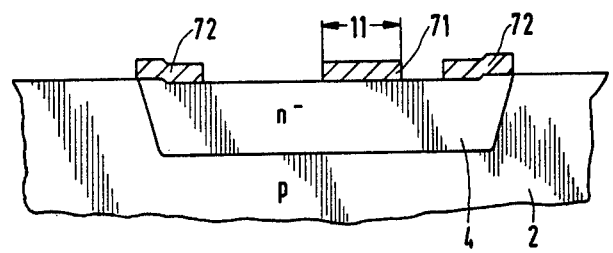

It is possible, according to FIG. 1, to start out from a p-doped plate-shaped silicon substrate of small doping, having a specific resistance ranging between 1 and 100 ohm.cm, which is covered with a thermally grown oxide mask 12, and is subjected to a small-dose implantation process ranging from $10^{12}$ to $10^{14}$ cm$^{-2}$.

After this, and in an oxidizing atmosphere, there is carried out a diffusion process in the course of which there is produced the collector region 4. The main surface is exposed and the oxidation masking layer 7 of silicon nitride is deposited. Instead of a silicon nitride layer 7 it is also possible to use a multilayer structure which is topped by the silicon nitride layer. In either case, the materials are to be chosen thus that the oxidation masking layer 7 is capable of being selectively etched with respect to the etch masking layer 6 to be deposited later on (cf. FIG. 4).

Figure 8:
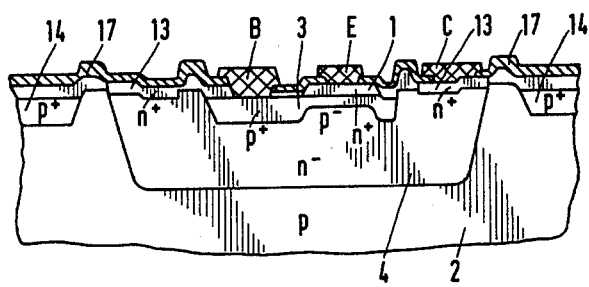

Out of this oxidation masking layer 7 are etched the oxidation masking layer portions 71 and 72, of which the oxidation masking layer portion 71 covers the emitter area 11, and the layer portion 72 covers the area of the collector contact region 13 (FIG. 8).

Figure 4:
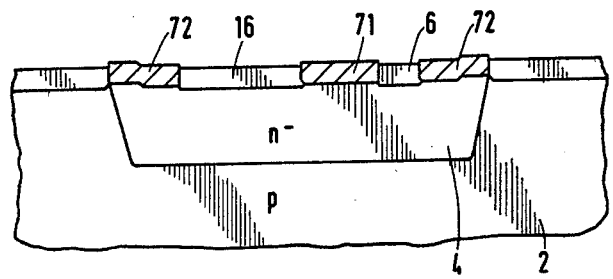

Thereafter, in the course of a thermal oxidation process, and as shown in FIG. 4, there is deposited the etch masking layer 6 of $SiO^2$ which remains during the later etching process for removing the oxidation masking layer portions 71 and 72 consisting of silicon nitride.

Figure 5:
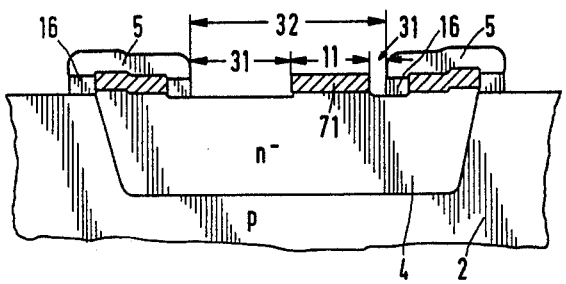

Thereafter, according to FIG. 5, the photoresist mask 5 is deposited, leaving vacant the base area 32. The photoresist mask 5 ends opposite the pn junction between the collector region 4 and the substrate 2, so that in the course of the subsequently performed implantation processes of p-doped impurities there will result outside the collector region 4 a channel stopper region 14 surrounding the latter in a frame shaped manner, as is illustrated in FIG. 6.

Figure 6:
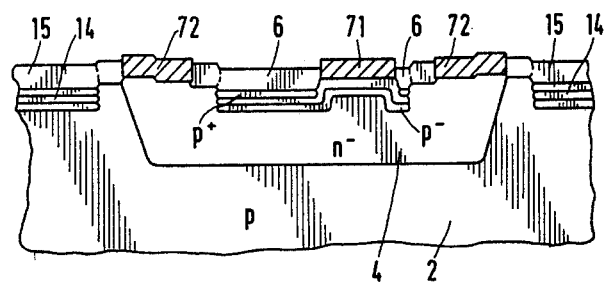

The implantation of doping ions of the conductivity type of the base region 3, as a result of which there is obtained the arrangement as shown in FIG. 6, is effected in two steps in any optional order of sequence. At a relatively small accelerating energy, doping ions are implanted into the exposed outer base area 31 outside the emitter area 11 at a relatively high accelerating energy which is sufficient for penetrating the oxidation masking layer portion 71, doping ions of the same conductivity type are implanted into the entire base area 32 including the emitter area 11. Preferably the high-energy implantation is carried out with a small dose of approximately $10^{12}$ to $10^{13}$ cm$^{-2}$, and the implantation of relatively small energy is carried out with a dose considerably increased in relation thereto in order thus to obtain a low instrinsic base resistance.

Figure 7:
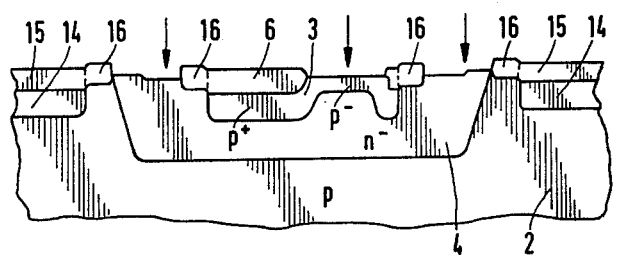

Subsequently, after the extrinsic base portion 31 has been provided with the masking layer 6 and 15, the semiconductor substrate is subjected to a selective etching agent attacking silicon nitride, in particular to hot phosphoric acid, and the oxidation masking layer portions 71 and 72 are removed, as is shown in FIG. 7.

After this, n-doping impurities of the conductivity type of the emitter region are implanted into the surface, for which the etching masking layer 6, the simultaneously produced oxide layer portions 15 and the parts of the thermally produced oxide layer 16 covered by the photoresist mask 5, are used as a masking effective against the implantation. There is carried out an implantation of n-doping ions in a relatively high dose of $10^{15}$ to $10^{16}$, in order thus to obtain a high emitter efficiency and a low-ohmic collector contact region 14.

Following the implantation, the entire arrangement is covered with a foreign oxide layer 17, and simultaneously there is carried out below this foreign oxide layer 17, the base area diffusion as well as the emitter diffusion by activating the dopings.

Upon attachment of the emitter contact E, of the base contact B and of the collector contact C there is obtained the monolithic integrated planar transistor as shown in FIG. 8.

The process according to the invention may be used to manufacture pnp or npn planar transistor having a high cut off frequency. In the embodiment of FIGS. 9 through 14 the process for manufacturing an npn planar transistor is shown, starting from a p-doped substrate. The collector region 4 is not manufactured by employing a masked implantation, but by an etching process following the implantation, over the one main surface of the plate-shaped substrate 2. Prior to the diffusion of the collector region 4, the collector area 9 of the substrate 2 of silicon, according to FIG. 10, is covered with an oxidation masking layer 7.

Figure 9:
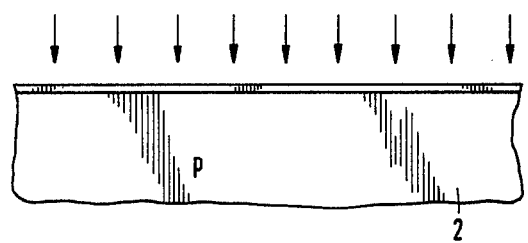
FIGS. 9 to 14 are similar views of a second example of embodiment according to the invention; and of which FIG. 15, in the same partly sectional shows a monolithic integrated planar transistor, manufactured in accordance with a further embodiment of the process according to the invention.
Figure 10:
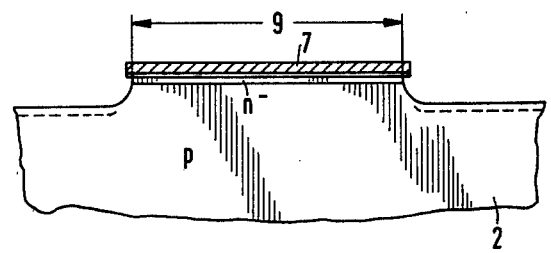

As shown in FIG. 9 n-doping ions are implanted into the entire surface of relatively high-ohmic p-doped plate shaped substrate 2. The entire main surface is covered with an oxidation layer. Out of this layer there is etched the masking layer 7. Thereafter, the substrate 2 is removed around the collector area 9 by employing the oxidation masking layer 7 as an etching mask, and by employing an etching agent selectively attacking the substrate 2, as is shown in FIG. 10. For manufacturing a region 14 surrounding the collector region 4, for preventing an unwanted conducting channel formation, it is possible to implant ions of the conductivity type of the substrate 2 into the exposed substrate surface, with this being indicated by the dashed line in FIG. 10.

Figure 11:
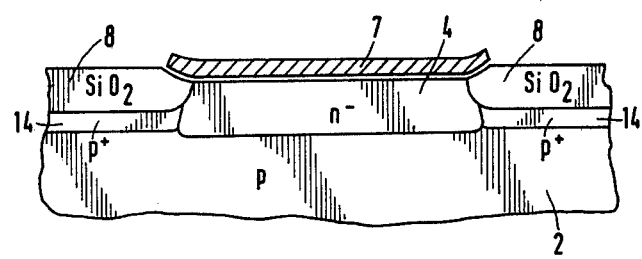

Finally, there is carried out a thermal oxidation for forming the thick oxide layer 8 as shown in FIG. 11, in which the region 14 preventing the formation of an unwanted conducting channel, has already been partly formed.

Figure 12:
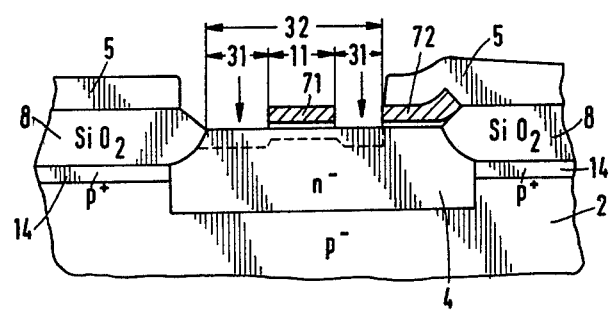

After this, as is shown in FIG. 12, the oxidation masking layer portion 71 covering the emitter area 11, is etched out of the oxidation masking layer 7, and the photoresist mask 5 is deposited, defining the base area 32 as well for the purpose of effecting a restriction.

Now, in any optional order of sequence, there are carried out the two implantation processes at different accelerating energies and dose rates of ions of the conductivity type of the base region, as is indicated by the dashlines in FIG. 12.

Figure 13:
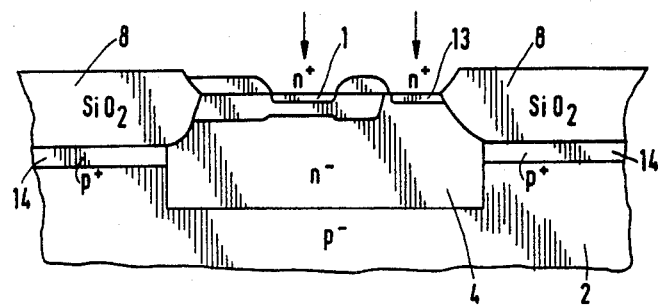
Figure 14:
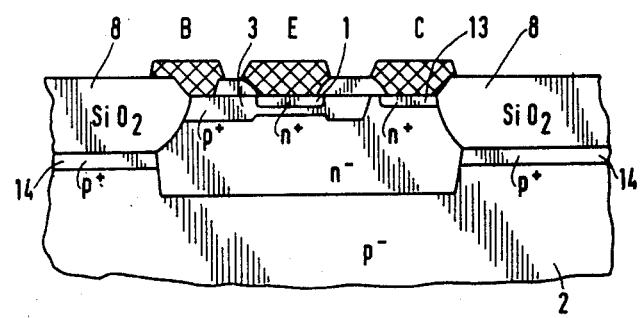

Following the selective removal of the oxidation masking layer portions 71 and 72, there is carried out the implantation of the dopings of the emitter region 1 and those of the collector contacting region 13 according to FIG. 13 which shows the arrangement after the ions have been activated. Finally, there are attached the base contact B, the emitter contact E and the collector contact C as shown in FIG. 14.

The possibility of making the process according to the invention compatible with the Si gate technology results from the fact that the oxidation masking layer portion 71 is etched out in such a way that its rim portion partly extends along the rim portion of the thick oxide layer 8. In this case, an emitter region 1 results which with part of its circumference, borders on the thick oxide layer 8 penetrating deeper into the substrate 2 than the emitter region 1. Finally, there is obtained an integrated planar transistor as shown in FIG. 15, whose base electrode B comes to lie between the emitter electrode E and the collector electrode C.

Figure 15:
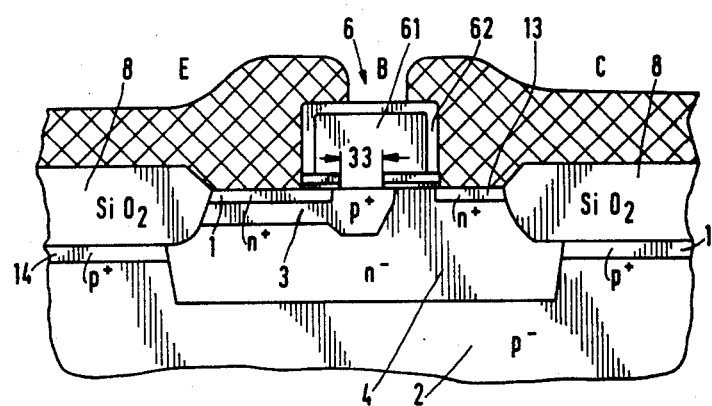

Moreover, integrated planar transistors as shown in FIG. 15 are suitable for explaining a further embodiment of the process in which, into the etch masking layer, there is embedded a contacting layer 61 of doped polycrystalline silicon, with this layer superficially contacting the base region 3. For manufacturing such a contacting structure, for example, in one stage of the process according to FIG. 10, there is provided in the oxidation masking layer 7 as deposited over the collector area 9, a contacting opening 33 (FIG. 15) and subsequently thereto, there is carried out the implantation process of p-doping impurities mentioned hereinbefore in connection with FIG. 10. Subsequently thereto, there is effected the embodiment of the contacting layer 61 by evaporating polycrystalline silicon and restricting it over the area of the collector region which is not to be subjected to the process of implanting n-doping impurities. The doping of the contacting layer 61 may be carried out prior to a thermal oxidation thereof in the course of an implantation process. Accordingly, there is obtained an etch masking layer 6 permitting the selective removal of the not-shown oxidation masking layer over both the emitter area and the collector contacting area.

The sectional view in FIG. 15, of a monolithic integrated planar transistor manufactured by employing the process according to the invention has, at first sight, a certain similarity to an n-channel Si-gate field-effect transistor. Actually, the process according to the invention, at least as far as the integration of Si-gate field-effect transistors of the conductivity type of the emitter region of the bipolar planar transistor is concerned, is completely compatible, because certain working processes have to be restricted alone to the scope of the bipolar planar transistor. In fact, when the oxidation masking layer or the oxidation masking layer portion 7 is deposited on to the substrate 2 in such a thickness and composition as is necessary for use on a Si-gate electrode of a Si-gate field-effect transistor, when omitting the etching process for the contacting opening 33 (FIG. 15) within the area of the field-effect transistor, and when the implantation of the doping material of the base region 3 within the area of the field-effect transistor is masked by a photoresist mask, there will be obtained the aforementioned n-channel-Si-field-effect transistor as is easily recognizable from FIG. 15. Relative thereto, the portion of the contacting layer 61 between the regions 1 and 13 represents the gate electrode. The emitter region 1 and the collector contacting region 13 may be used as source or drain regions respectively. The doping of the regions 3 and 4 may then be omitted.

Obviously, and when looking at FIG. 15, an extensive compatibility with the manufacture of a p-channel-Si-field-effect transistor, results from the fact that the contacting opening 33 as well as the implantation and dopings of the base region can be omitted, and that the regions 1 and 13 are doped p-conductively during the implantation of the region 14.

The compatibility of the process according to the invention with respect to the co-integration of Si-gate transistors, when employing an etch masking layer into which there is embedded a contacting layer consisting of a doped polycrystalline silicon, is still amended by the possibility of producing ohmic resistors from the polycrystalline silicon which, if so required, is embedded in a track-shaped manner into the etch masking layer 6. The resistance values thereof can be adjusted within wide limits by selecting the dimensions of the conductor tracks and the selective dopings in the course of the implantation processes which are necessary anyway.

I claim:

1. In a process for manufacturing a monolithic integrated solid state circuit comprising at least one bipolar planar transistor having an emitter region on one side of a semiconducting substrate bordering a base region which is diffused into a collector region, the steps comprising:
    inserting and diffusing dopants for said collector region into said surface side within said collector area by a masked implantation;
    forming an oxidation masking layer portion over an emitter area;
    depositing a photoresist mask defining a base area;
    ion implanting a first dose of doping ions of a first conductivity type at a first accelerating energy such that said photoresist mask is penetrated but not said oxidation masking layer portion;
    ion implanting a second dose of doping ions of said first conductivity type at a second accelerating energy sufficient to penetrate said photoresist mask and said oxidation masking layer portion at a second dosing, said second dosing being small relative to said first dose;
    remaining said photoresist mask;
    covering said base area outside said emitter area with an etch masking layer which is resistant to the etchings of material of said oxidation masking layer portions;
    etching to remove said oxidation masking layer;
    implanting dopings of the conductivity type of said emitter region;
    carrying out base area diffusion and emitter area diffusion by activating the dopings of the base area and emitter area; and
    wherein the order of said two ion implanting steps may be interchanged.

2. A process in accordance with claim 1, wherein said oxidation masking layer is silicon nitride, and said etch masking layer is produced by way of thermal oxidation of the semiconductor surface of said base area.

3. A process as claimed in accordance with claim 1 comprising the intermediate step before both said base zone diffusion and said emitter zone diffusion steps of depositing a foreign oxide layer.

4. A process in accordance with claim 2 comprising the intermediate step of embedding into said etch masking layer a contacting layer of a doped polycrystalline silicon which superficially contacts said base region.

5. A process as claimed in accordance with claim 2 comprising the intermediate step before both said base zone diffusion and said emitter zone diffusion steps of depositing a foreign oxide layer.

6. A process as claimed in accordance with claim 4 comprising the intermediate step before both said base zone diffusion and said emitter zone diffusion steps of depositing a foreign oxide layer.

7. A process in accordance with claim 1, 2 or 4 comprising the steps of:
    covering said collector area with a layer of a material of the oxidation masking layer prior to diffusing said collector region dopants;
    thereafter removing a portion of said substrate around said collector area by employing said oxidation masking layer as an etching mask, and by using an etching against selectively attacking said substrate;
    subjecting the exposed surface of said substrate to a thermal oxidation by forming a thick oxide layer; and
    thereafter etching said oxidation masking layer covering said collector area to produce said oxidation masking layer portion.

8. A process in accordance with claim 7, wherein said oxidation masking layer portion is etched out in such a way that its rim portion will partially extend along the rim portion of said thick oxide layer.

9. A process in accordance with claim 7 wherein said oxidation masking layer or said oxidation masking layer portion is deposited in such a thickness and composition on to said substrate as is necessary for being used on a Si-gate electrode of an insulated-gate field-effect transistor.

10. A process as claimed in accordance with claim 7 comprising the intermediate step before both said base zone diffusion and said emitter zone diffusion steps of depositing a foreign oxide layer.

11. A process in accordance with claim 8 wherein said oxidation masking layer or said oxidation masking layer portion is deposited in such a thickness and composition on to said substrate as is necessary for being used on a Si-gate electrode of an insulated-gate field-effect transistor.

12. A process as claimed in accordance with claim 8 comprising the intermediate step before both said base zone diffusion and said emitter zone diffusion steps of depositing a foreign oxide layer.

13. A process in accordance with claim 9 wherein said oxidation masking layer adjacent a contacting layer contacting the base region of a bipolar planar transistor contains an electrode layer which does not contact the substrate surface lying there beneath, and said electrode layer is used as the gate electrode of an insulated-gate field-effect transistor whose source region area and whose drain region area are doped simultaneously with the doping of the emitter region area of said bipolar planar transistor.

14. A process as claimed in accordance with claim 9 comprising the intermediate step before both said base zone diffusion and said emitter zone diffusion steps of depositing a foreign oxide layer.

15. A process as claimed in accordance with claim 13 comprising the intermediate step before both said base zone diffusion and said emitter zone diffusion steps of depositing a foreign oxide layer.

16. A process in accordance with claim 11 wherein said oxidation masking layer adjacent a contacting layer contacting the base region of a bipolar planar transistor, contains an electrode layer which does not contact the substrate surface lying there beneath, and said electrode layer is used as the gate electrode of an insulated-gate field-effect transistor whose source region area and whose drain region area are doped simultaneously with the doping of the emitter region area of said bipolar planar transistor.

17. A process as claimed in accordance with claim 11 comprising the intermediate step before both said base zone diffusion and said emitter zone diffusion steps of depositing a foreign oxide layer.

* * * * *